United States Patent
Parimi et al.

(10) Patent No.: US 11,830,706 B2
(45) Date of Patent: Nov. 28, 2023

(54) HEATED PEDESTAL DESIGN FOR IMPROVED HEAT TRANSFER AND TEMPERATURE UNIFORMITY

(71) Applicant: Applied Materials, Inc., Santa Clara, CA (US)

(72) Inventors: Venkata Sharat Chandra Parimi, Santa Clara, CA (US); Zubin Huang, Santa Clara, CA (US); Jian Li, Fremont, CA (US); Satish Radhakrishnan, San Jose, CA (US); Rui Cheng, Santa Clara, CA (US); Diwakar N. Kedlaya, San Jose, CA (US); Juan Carlos Rocha-Alvarez, San Carlos, CA (US); Umesh M. Kelkar, Santa Clara, CA (US); Karthik Janakiraman, San Jose, CA (US); Sarah Michelle Bobek, Sunnyvale, CA (US); Prashant Kumar Kulshreshtha, San Jose, CA (US); Vinay K. Prabhakar, Cupertino, CA (US); Byung Seok Kwon, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 1004 days.

(21) Appl. No.: 16/703,140

(22) Filed: Dec. 4, 2019

(65) Prior Publication Data

US 2020/0234932 A1 Jul. 23, 2020

Related U.S. Application Data

(60) Provisional application No. 62/794,373, filed on Jan. 18, 2019.

(51) Int. Cl.
| | |
|---|---|
| *H01L 21/67* | (2006.01) |
| *H05B 3/10* | (2006.01) |
| *H01J 37/32* | (2006.01) |
| *C23C 16/458* | (2006.01) |
| *C23C 16/50* | (2006.01) |

(Continued)

(52) U.S. Cl.
CPC .... *H01J 37/32724* (2013.01); *C23C 16/4583* (2013.01); *C23C 16/4586* (2013.01);
(Continued)

(58) Field of Classification Search
None
See application file for complete search history.

(56) References Cited

U.S. PATENT DOCUMENTS 5,903,428 A * 5/1999 Grimard ............. H01L 21/6833
279/128
6,494,955 B1 * 12/2002 Lei .................... H01L 21/68785
118/724

(Continued)

FOREIGN PATENT DOCUMENTS

| JP | H11330219 A | 11/1999 |
| JP | 2004221323 A | 8/2004 |

(Continued)

OTHER PUBLICATIONS

International Search Report and Written Opinion for Application No. PCT/US2019/062320 dated Mar. 25, 2020.

(Continued)

*Primary Examiner* — Nathaniel E Wiehe
*Assistant Examiner* — Elizabeth M Kerr
(74) *Attorney, Agent, or Firm* — Patterson + Sheridan, LLP

(57) ABSTRACT

Embodiments of the present disclosure generally relate to a pedestal for increasing temperature uniformity in a substrate supported thereon. The pedestal comprises a body having a heater embedded therein. The body comprises a patterned surface that includes a first region having a first plurality of posts extending from a base surface of the body at a first height, and a second region surrounding the central region having a second plurality of posts extending from the base (Continued)

surface at a second height that is greater than the first height, wherein an upper surface of each of the first plurality of posts and the second plurality of posts are substantially coplanar and define a substrate receiving surface.

19 Claims, 9 Drawing Sheets

(51) Int. Cl.
*C23C 16/46* (2006.01)
*H05B 3/14* (2006.01)

(52) U.S. Cl.
CPC .............. *C23C 16/46* (2013.01); *C23C 16/50* (2013.01); *H01J 37/32715* (2013.01); *H01L 21/67103* (2013.01); *H05B 3/10* (2013.01); *H05B 3/143* (2013.01); *H01J 2237/2007* (2013.01); *H01J 2237/3321* (2013.01)

(56) References Cited

U.S. PATENT DOCUMENTS

| | | | | |
|---|---|---|---|---|
| 2003/0047202 A1* | 3/2003 | Worm | ............... | H01L 21/68792 |
| | | | | 134/902 |
| 2007/0040265 A1* | 2/2007 | Umotoy | ............ | C23C 16/45521 |
| | | | | 257/704 |
| 2017/0140970 A1* | 5/2017 | Boyd, Jr. | ............ | H01L 21/6875 |
| 2018/0033672 A1* | 2/2018 | Woytowitz | .......... | C23C 16/4581 |
| 2018/0148835 A1 | 5/2018 | Erickson et al. | | |

FOREIGN PATENT DOCUMENTS

| | | | | |
|---|---|---|---|---|
| JP | 2013153171 A | | 8/2013 | |
| JP | 2014236047 A | | 12/2014 | |
| JP | 2017191949 A | * | 10/2017 | ............... B23Q 3/15 |
| JP | 2017191949 A | | 10/2017 | |
| TW | I505400 B | | 10/2015 | |
| TW | 201810382 A | | 3/2018 | |

OTHER PUBLICATIONS

Office Action in related application TW 108147140 dated Jul. 6, 2020.

Office Action in related application TW 108147140 dated Nov. 4, 2020.

\* cited by examiner

HEATED PEDESTAL DESIGN FOR IMPROVED HEAT TRANSFER AND TEMPERATURE UNIFORMITY

CROSS-REFERENCE TO RELATED APPLICATION

This application claims benefit of U.S. Provisional Patent Application Ser. No. 62/794,373, filed Jan. 18, 2019, which is hereby incorporated by reference herein.

BACKGROUND

Field

Embodiments of the present disclosure generally relate to methods and apparatus for a heated pedestal utilized in semiconductor device fabrication processes.

Description of the Related Art

In the manufacture of electronic devices on a substrate, substrates, such as a semiconductor substrate, are subjected to many thermal processes. The thermal processes are typically performed in a processing chamber where material is deposited or removed, or a substrate is heated in a controlled manner. Such processes include epitaxial deposition, chemical vapor deposition (CVD), plasma enhanced chemical vapor deposition (PECVD), etching, annealing, and the like.

A substrate is typically supported in the processing chamber by a heated substrate support or pedestal that transfers the heat to the substrate. However, the pedestal may provide a non-uniform temperature field due to the design and layout of the heating mechanism which prevents portions of the substrate to be heated at the same rate as other portions thereof. This results in temperature non-uniformity of the substrate being heated.

Thus, there is a need for an improved pedestal that provides greater temperature uniformity in a substrate heated thereon.

SUMMARY

Embodiments of the present disclosure generally relate to an apparatus and method for a pedestal utilizable to increase temperature uniformity in a substrate supported thereon. In one embodiment, a pedestal is disclosed that comprises a body having a heater embedded therein. The body comprises a patterned surface that includes a first region having a first plurality of posts extending from a base surface of the body at a first height, and a second region surrounding the central region having a second plurality of posts extending from the base surface at a second height that is greater than the first height, wherein an upper surface of each of the first plurality of posts and the second plurality of posts are substantially coplanar and define a substrate receiving surface.

In another embodiment, a pedestal is disclosed that includes a body having a heater embedded therein. The body comprises a patterned surface comprising a central region having a first plurality of posts extending from a base surface of the body at a first height, and a peripheral region surrounding the central region having a second plurality of posts extending from the base surface at a second height that is greater than the first height, wherein an upper surface of each of the first plurality of posts and the second plurality of posts are substantially coplanar and define a substrate receiving surface.

In another embodiment, a method is disclosed that includes forming a ceramic body with a heater embedded therein, forming a plurality of posts in an upper surface of the ceramic body such that each of the posts extend a first height from the ceramic body, placing a mask on a first portion of the plurality of posts, and increasing the first depth of a second portion of the plurality of posts.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a heated pedestal for a process chamber. The heated pedestal includes a patterned surface of grooves surrounding a plurality of projections or posts. The posts have different heights across the pedestal. Methods for making the pedestal are also disclosed. The heated pedestal having the patterned surface improves temperature uniformity which enables more uniform heat transfer to a substrate, which improves temperature uniformity of the substrate chucked or positioned thereon. The improved temperature uniformity improves film thickness uniformity of processed films on the substrate.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal and/or bake the substrate surface. In addition to film processing directly on the surface of the substrate, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

Figure 1:
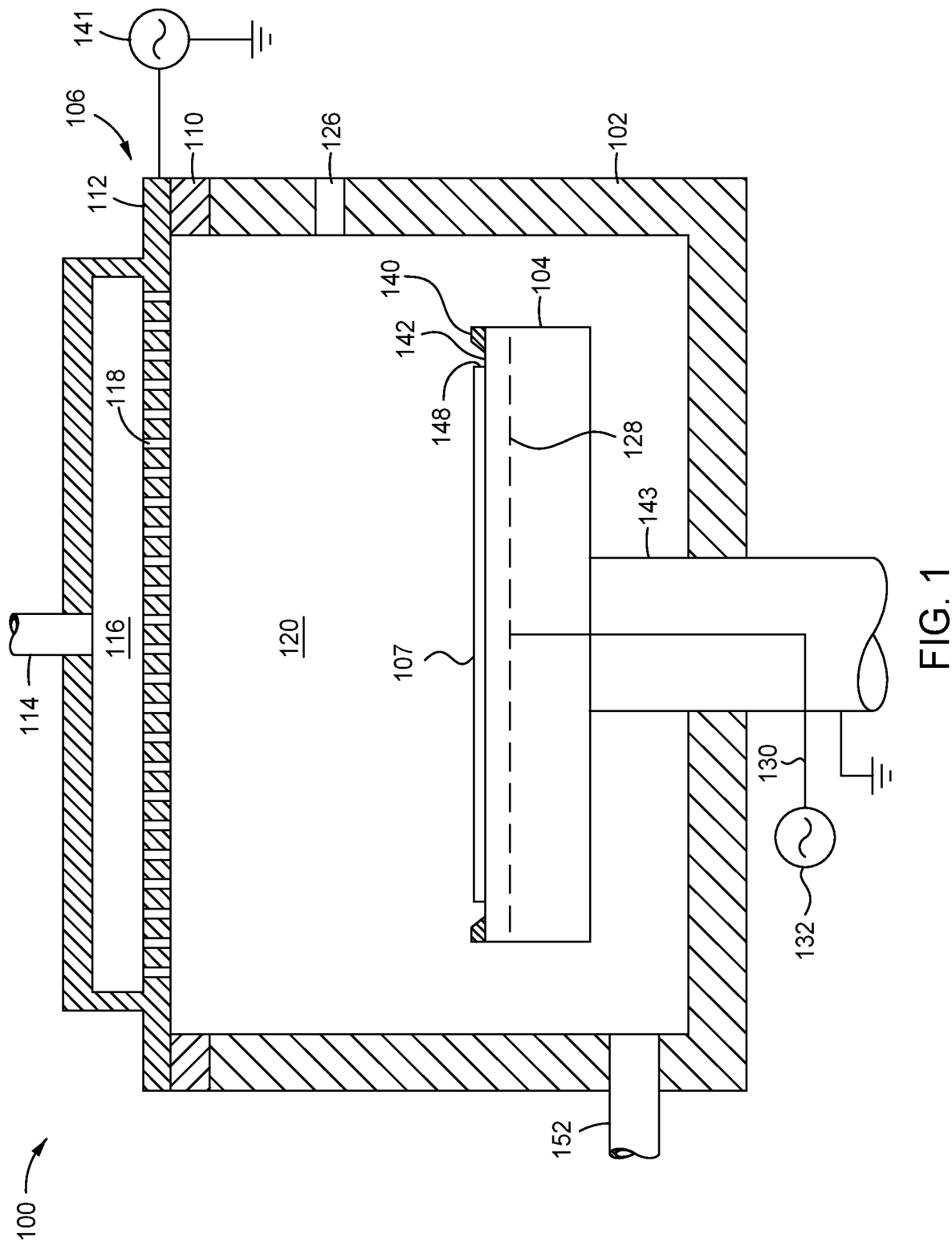
FIG. 1 is a schematic cross-sectional view of a process chamber according to one embodiment described herein.

FIG. 1 is a schematic cross-sectional view of a processing chamber 100 according to one embodiment described herein. The processing chamber 100 may be a chemical vapor deposition (CVD) chamber, a plasma enhanced chemical vapor deposition (PECVD) chamber or other thermal process chamber. An exemplary processing chamber which may benefit from the embodiments described herein is the PRODUCER® series of PECVD enabled chambers, available from Applied Materials, Inc., Santa Clara, CA It is contemplated that other similarly equipped process chambers from other manufacturers may also benefit from the embodiments described herein.

The processing chamber 100 includes a chamber body 102, a pedestal 104 disposed inside the chamber body 102, and a lid assembly 106 coupled to the chamber body 102 and enclosing the pedestal 104 in a processing region 120. The lid assembly 106 includes a gas distributor 112. A substrate 107 is provided to the processing region 120 through an opening 126 formed in the chamber body 102.

An isolator 110, which may be a dielectric material such as a ceramic or metal oxide, for example aluminum oxide and/or aluminum nitride, separates the gas distributor 112 from the chamber body 102. The gas distributor 112 includes openings 118 for admitting process gases into the processing region 120. The process gases may be supplied to the processing chamber 100 via a conduit 114, and the process gases may enter a gas mixing region 116 prior to flowing through the openings 118. An exhaust 152 is formed in the chamber body 102 at a location below the pedestal 104. The exhaust 152 may be connected to a vacuum pump (not shown) to remove unreacted species and by-products from the processing chamber 100.

The gas distributor 112 may be coupled to an electric power source 141, such as an RF generator or a DC power source. The DC power source may supply continuous and/or pulsed DC power to the gas distributor 112. The RF generator may supply continuous and/or pulsed RF power to the gas distributor 112. The electric power source 141 is turned on during the operation to supply an electric power to the gas distributor 112 to facilitate formation of a plasma in the processing region 120.

The pedestal 104 may be formed from a ceramic material, for example a metal oxide or nitride or oxide/nitride mixture such as aluminum, aluminum oxide, aluminum nitride, or an aluminum oxide/nitride mixture. The pedestal 104 is supported by a shaft 143. The pedestal 104 may be grounded. A heater 128 is embedded in the pedestal 104. The heater 128 may be a plate, a perforated plate, a mesh, a wire screen, or any other distributed arrangement. The heater 128 is coupled to an electric power source 132 via a connection 130. The electric power source 132 may be a power supply that controls the heater 128. In some embodiments, the heater 128 may be an electrode such that the pedestal 104 functions as an electrostatic chuck. Thus, the electric power supply may also be an RF generator. When the heater 128 functions as an electrode, the electric power source 132 may be utilized to control properties of the plasma formed in the processing region 120, or to facilitate generation of the plasma within the processing region 120. For example, the electric power source 141 and the electric power source 132 may be tuned to two different frequencies to promote ionization of multiple species in the processing region 120. In one example, the electric power source 141 and the electric power source 132 may be utilized to generate a capacitively-coupled plasma within the processing region 120.

The pedestal 104 includes a patterned surface 142 for supporting the substrate 107. The pedestal 104 may also include a pocket 140. The pocket 140 may alternatively be an edge ring. The substrate 107 and the pocket 140 may be concentrically disposed on the surface 142 of the pedestal 104.

Figure 2A:
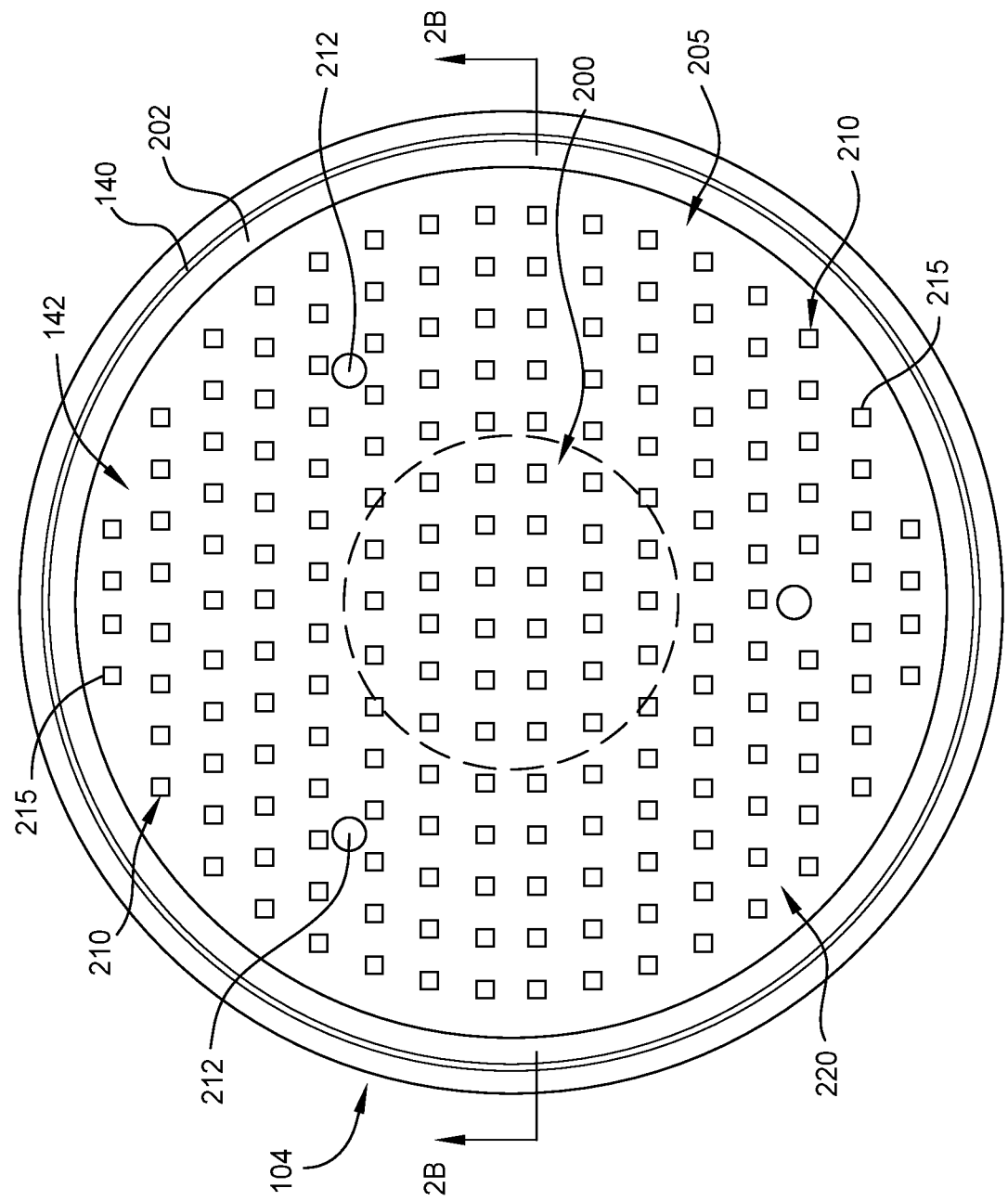
FIG. 2A is a top plan view of a pedestal of FIG. 1 having one embodiment of a patterned surface.
Figure 2B:
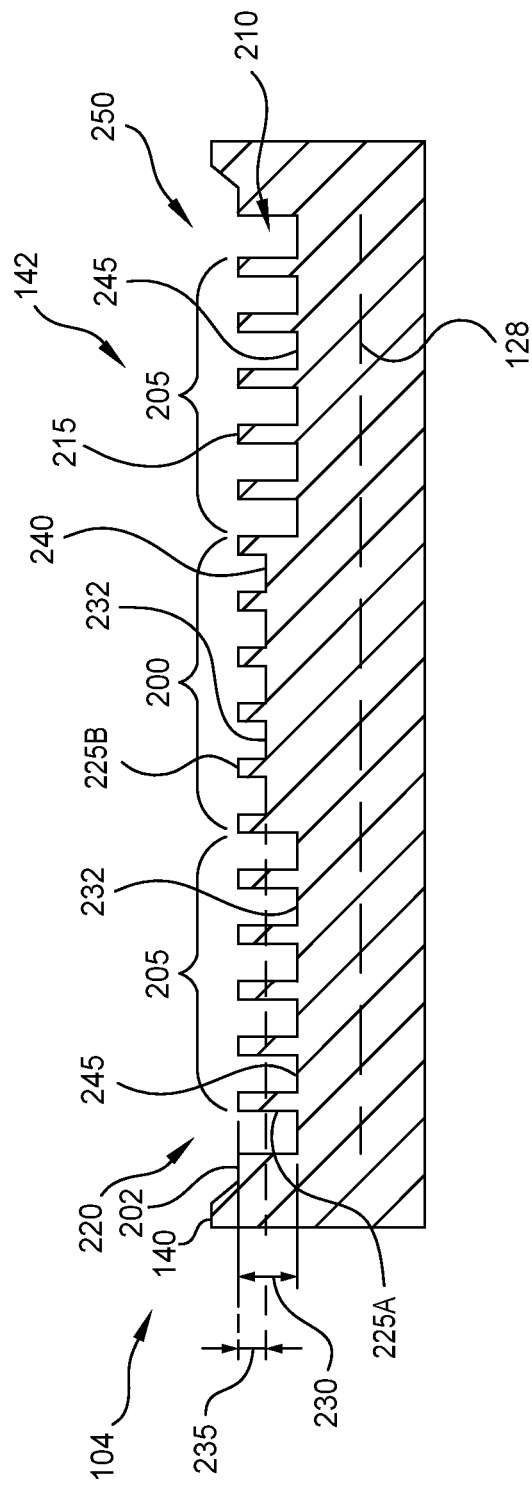
FIG. 2B is a sectional view of the pedestal of FIG. 2A.

FIG. 2A is a top plan view of a pedestal 104 of FIG. 1 having one embodiment of a patterned surface 142. FIG. 2B is a sectional view of the pedestal 104 of FIG. 2A.

The pedestal 104 shown in FIG. 2A includes a peripheral ledge 202 that is surrounded by the pocket 140. The patterned surface 142 includes two distinct regions, such as a central region 200 surrounded by a peripheral region 205. The patterned surface 142 includes a plurality of posts 210 that have an upper surface 215 that defines a substrate receiving surface 220. The central region 200 differs from the peripheral region 205 by heights of the posts 210 formed therein. The upper surface 215 of each of the plurality of posts 210 are substantially coplanar.

Each of the plurality of posts 210 are shown as being rectangular in plan view, but the posts 210 may be circular, oval, hexagonal, or other shape in plan view. The posts 210 are shown as circular in FIGS. 8A and 9. A plurality of lift pin holes 212 are also shown in FIG. 2A.

In some embodiments, the central region 200 has a surface area less than a surface area of the peripheral region 205. For example, if the diameter of the patterned surface 142 is about 12 inches, the surface area of the peripheral region 205 is about 113 square inches, and the surface area of the central region 200 is about 11 square inches. In some embodiments, the surface area of the peripheral region 205 is about 900% greater than a surface area of the central region 200. The upper surface 215 of each of the plurality of posts 210 includes a surface roughness (average surface roughness or Ra) of about 40 micro inches.

As shown in FIG. 2B, the plurality of posts 210 includes a plurality of first posts 225A in the peripheral region 205 and a plurality of second posts 225B in the central region 200. A height 230 of each of the plurality of first posts 225A is greater than a height 235 of the plurality of second posts 225B. The height 230 and the height 235 are measured from an upper surface or base surface 232 of the pedestal 104. In some embodiments, the height 230 of each of the plurality of first posts 225A is about 0.002 inches to about 0.0024 inches, such as about 0.0022 inches. In some embodiments, when compared to the height 230 of the plurality of first posts 225A, the height 235 of each of the plurality of second posts 225B is about 0.0005 inches to about 0.0007 inches, such as about 0.0006 inches. While only two different heights of the posts 210 are shown (i.e., height 230 and height 235), the patterned surface 142 may include another plurality of posts at a height that is different than the height 230 and the height 235.

In some embodiments, the height 230 is about 1.5 times greater than the height 235. In some embodiments, the height 230 is about 2 times greater than the height 235. In some embodiments, the height 230 is about 2.5 times greater than the height 235. In some embodiments, the height 230 is about 3 times greater than the height 235. In some embodiments, the height 230 is about 3.5 times greater than the height 235. In some embodiments, the base surface 232 of the pedestal 104 has a Ra that is greater than a Ra of the upper surface 215 of each of the plurality of posts 210. For example, the Ra of the base surface 232 is about 63 micro inches.

In other embodiments, the height 235 of each of the plurality of second posts 225B is 15 about microns (μm) while the height 230 of each of the plurality of first posts 225A is about 30 μm. In other embodiments, the height 235 of each of the plurality of second posts 225B is about 15 μm while the height 230 of each of the plurality of first posts 225A is about 55 μm. In other embodiments, the height 235 of each of the plurality of second posts 225B is about 30 μm while the height 230 of each of the plurality of first posts 225A is about 55 μm.

The difference in the heights 230 and 235, and/or the difference in the surface areas of the central region 200 and the peripheral region 205, changes heat transfer rates between the pedestal 104 and a substrate supported thereon. The modified heat transfer rates modify the temperature profile of the substrate. In some embodiments, the difference in the heights 230 and 235, and/or the difference in the surface areas of the central region 200 and the peripheral region 205 improves temperature uniformity in the substrate which improves deposition uniformity on the substrate. In some embodiments, having the height 235 of each of the plurality of second posts 225B that is less than the height 230 of each of the plurality of first posts 225A increases temperature in the center of a substrate. Increasing the temperature at a center of the substrate may improve the temperature uniformity of the entire substrate, which improves deposition uniformity on the substrate.

The heights 230 and 235 of the posts 210 make the base surface 232 of the pedestal 104 a multi-level structure. For example, the base surface 232 of the central region 200 defines a raised surface 240 as compared to the base surface 232 of the peripheral region 205, which is references as a recessed surface 245 compared to the raised surface 240. The raised surface 240 and the recessed surface 245 of the pedestal 104 shown in FIG. 2B defines a profile, such as an upside-down or reverse U-shaped profile 250.

FIGS. 3A-3D are various sectional views showing one embodiment of a fabrication method for the pedestal 104 shown and described in FIGS. 2A and 2B.

Figure 3A:
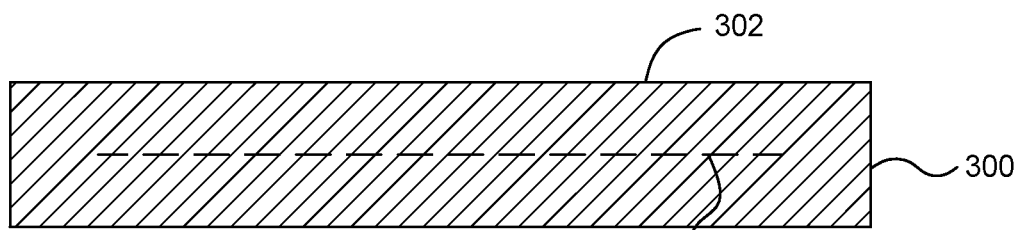
FIGS. 3A-3D are various sectional views showing one embodiment of a fabrication method for the pedestal shown and described in FIGS. 2A and 2B.
Figure 3B:
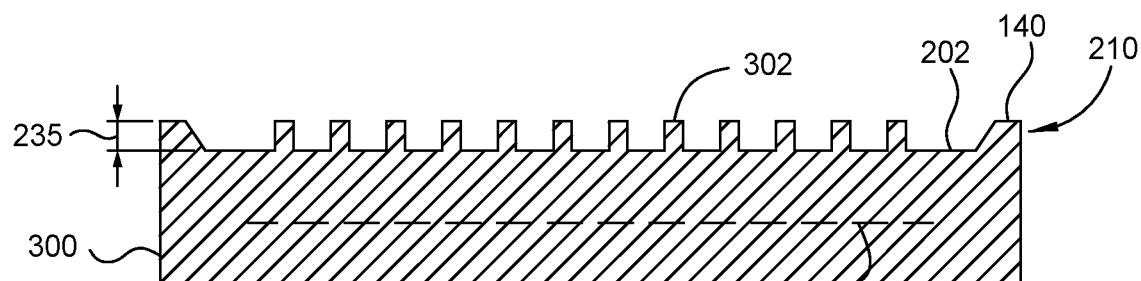

FIG. 3A shows a ceramic body 300 having the heater 128 embedded therein. In FIG. 3B, a plurality of posts 210 are formed in the ceramic body 300 by removing a portion of a surface 302 of the ceramic body 300. The surface 302 becomes the upper surface 215 of the plurality of posts 210. In some embodiments, each of the posts 210 are formed by a machining process, such as by a milling process performed on the ceramic body 300.

Figure 3C:
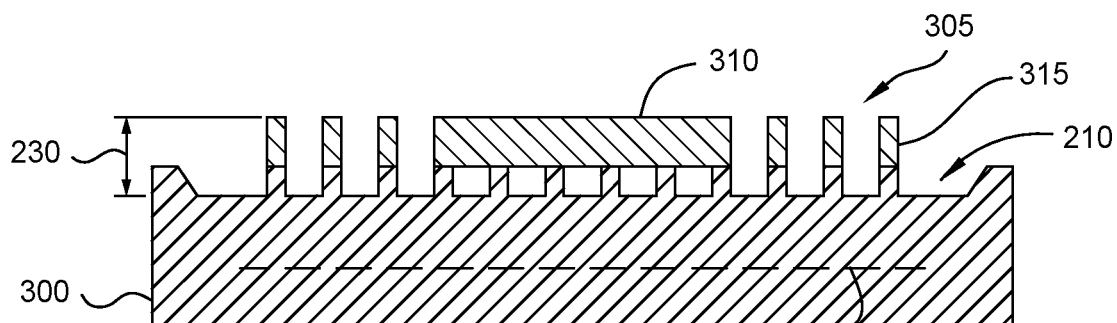

After the plurality of posts 210 are formed thereon, as shown in FIG. 3C, a mask pattern 305 is placed over a portion of the ceramic body 300 and all of the posts 210. For example, the mask pattern 305 includes a central mask 310 and a peripheral mask 315. The central mask 310 covers a central portion of the ceramic body 300 as well as the posts 210 therein and corresponds to the central region 200 of the pedestal 104 after formation thereof. The peripheral mask 315 covers the remainder of the posts 210 and corresponds to the peripheral region 205 of the pedestal 104 after formation thereof. With the mask pattern 305 in place the plurality of first posts 225A are formed to the height 230 by a bead blasting process. The central mask 310 shields the central portion of the ceramic body 300 and the posts 210, and the peripheral mask 315 shields the upper surface 215 of the posts 210 in the peripheral portion of the ceramic body 300.

Figure 3D:
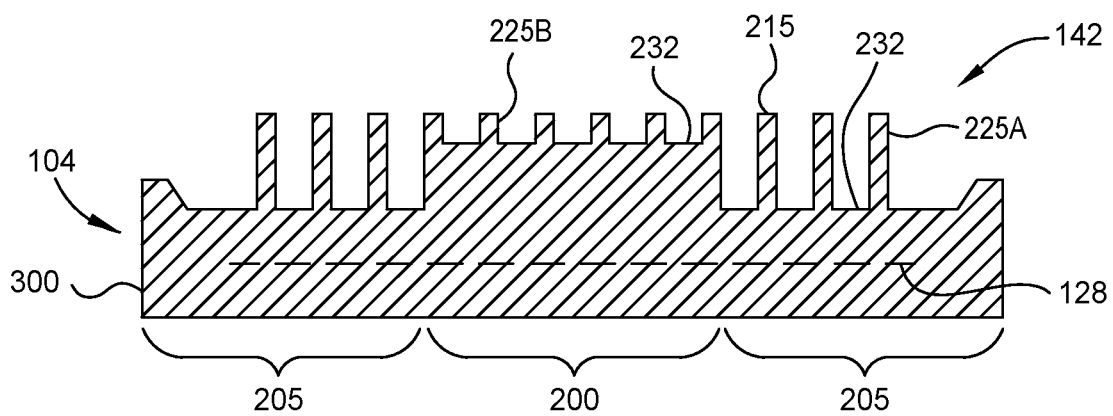

As shown in FIG. 3D, the mask pattern 305 is removed and the pedestal 104 is formed to have the plurality of first posts 225A and the plurality of second posts 225B in the peripheral region 205 and the central region 200 respectively.

FIGS. 4A-4D are various sectional views showing another embodiment of a fabrication method for the pedestal 104 shown and described in FIGS. 2A and 2B.

Figure 4A:
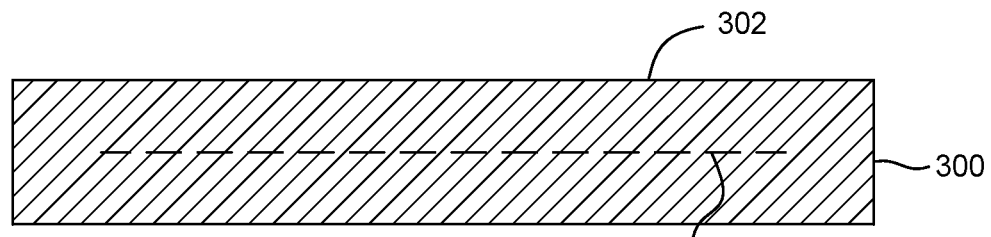
FIGS. 4A-4D are various sectional views showing another embodiment of a fabrication method for the pedestal shown and described in FIGS. 2A and 2B.
Figure 4B:
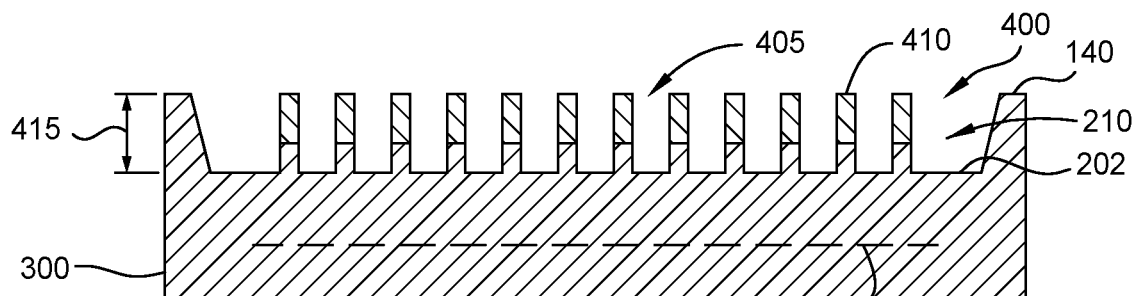

FIG. 4A shows a ceramic body 300 having the heater 128 embedded therein. In FIG. 4B, a first mask pattern 400 is placed on a ceramic body 300 to form the plurality of posts 210 to a height 415. The first mask pattern 400 includes a plurality of openings 405 formed therein, and discrete masks 410 that protects the surface 302 of the ceramic body 300.

Figure 4C:
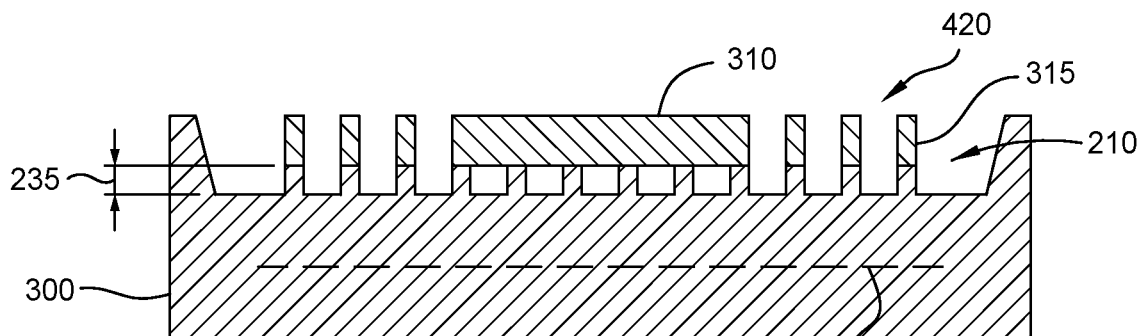

In FIG. 4C a second mask pattern 420 is placed on the ceramic body 300. The second mask pattern 420 is similar to the mask pattern 305. The central mask 310 covers a central portion of the ceramic body 300 as well as the posts 210 therein and corresponds to the central region 200 of the pedestal 104 after formation thereof. The peripheral mask 315 covers the remainder of the posts 210 and corresponds to the peripheral region 205 of the pedestal 104 after formation thereof. With the mask pattern 305 in place the plurality of first posts 225A are formed to the height 230 by a bead blasting process. The central mask 310 shields the central portion of the ceramic body 300 and the posts 210, and the peripheral mask 315 shields the upper surface 215 of the posts 210 in the peripheral portion of the ceramic body 300.

Figure 4D:
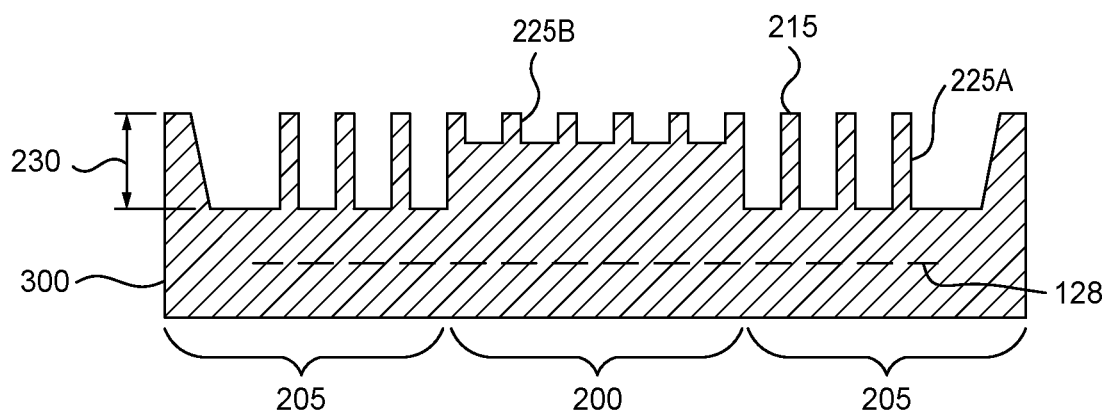

As shown in FIG. 4D, the second mask pattern 420 is removed and the pedestal 104 is formed to have the plurality of first posts 225A and the plurality of second posts 225B in the peripheral region 205 and the central region 200 respectively.

Figure 5:
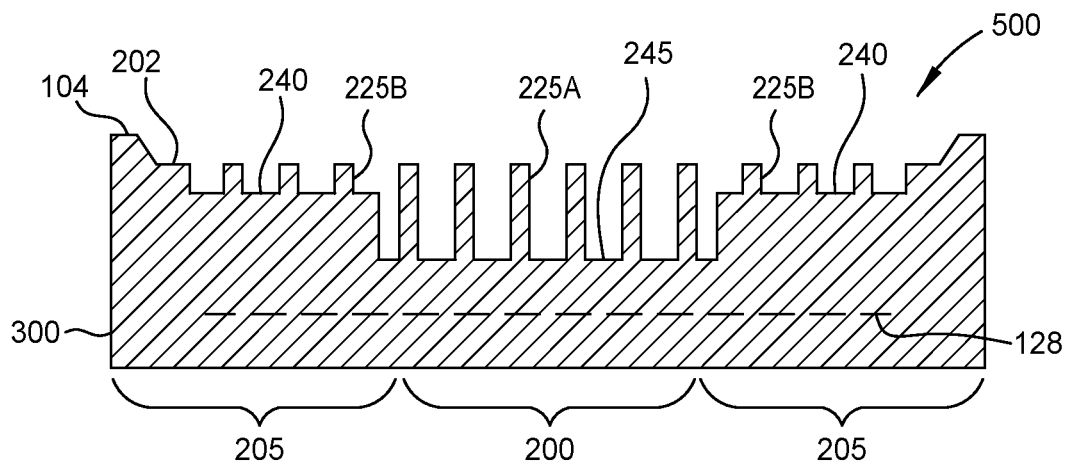
FIGS. 5-7 are sectional views of pedestals having various other embodiments of a patterned surface shown as a profile.
Figure 6:
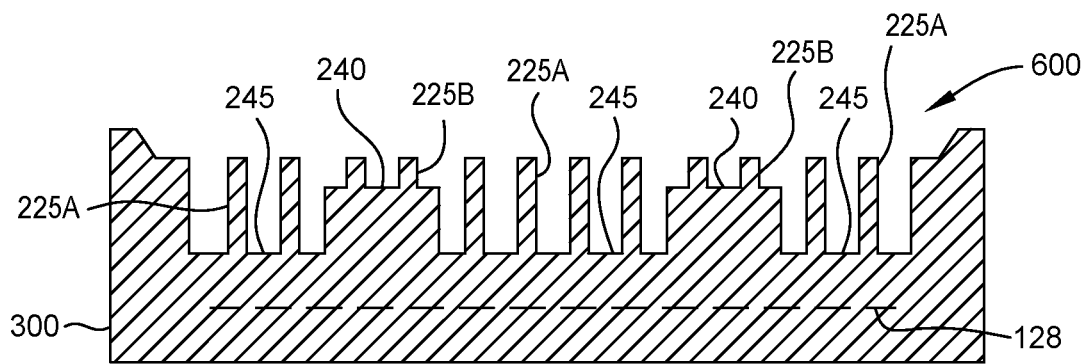
Figure 7:
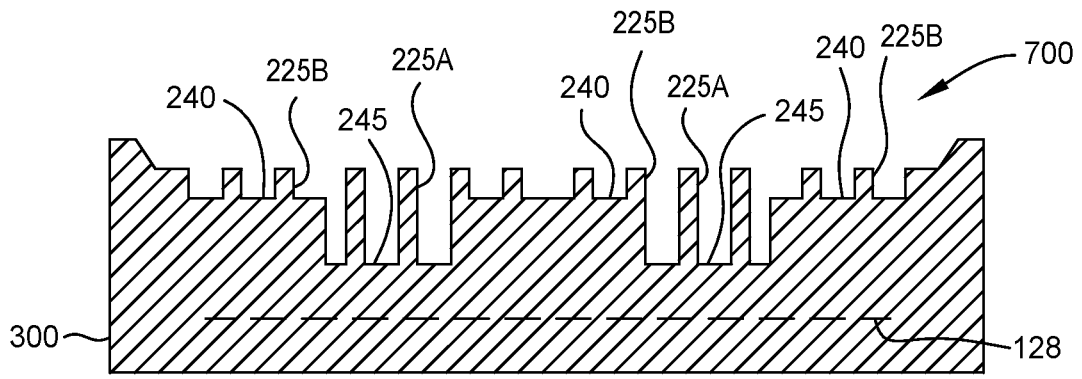

FIGS. 5-7 are sectional views of pedestals 104 having various other embodiments of a patterned surface shown as a profile. In the following Figures, various profiles of a pedestal 104 that may be utilized in the processing chamber 100 of FIG. 1 are disclosed.

FIG. 5 shows a pedestal 104 having a U-shaped profile 500. The U-shaped profile 500 includes the plurality of first posts 225A in the peripheral region 205 and/or on raised surfaces 240. The plurality of second posts 225B are in the central region 200 and/or on the recessed surface 245.

FIG. 6 shows a pedestal 104 having an M-shaped profile 600. The M-shaped profile includes two sets of the plurality of second posts 225B positioned on raised surfaces 240. The raised surfaces 240 are surrounded by three sets of the plurality of first posts 225A (in the central region and the peripheral region) positioned on recessed surfaces 245.

FIG. 7 shows a pedestal 104 having a W-shaped profile 700. The W-shaped profile includes three sets of the plurality of second posts 225B positioned on raised surfaces 240 (in the central region and the peripheral region). The raised surfaces 240 are adjacent to one of two sets of the plurality of first posts 225A positioned on recessed surfaces 245. While only the plurality of first posts 225A and the plurality of second posts 225B are shown in FIGS. 6 and 7 at two different heights, the patterned surface 142 may include another plurality of posts at a height that is different than the heights shown.

With increasing demands on feature sizes and the multi-operation integration processes used in logic and 3D NAND devices, it is beneficial to have very uniform deposition of thick films on silicon substrates such as oxide/nitride/carbon-based patterning films, etc. using PECVD processes. As a result of this, general specifications, and in terms of patterning films, localized deviations of uniformity drive customer specifications. The pedestal 104 as described herein meets or exceeds these specifications.

In terms of PECVD processing, to obtain a reliable substrate contact, and to prevent gross contamination of the substrate backside (which often contains device layers), substrate contact with is controlled. This control is accomplished by the patterns of posts on heaters, which provide a repeatable contact, and minimize issues due to variable contact, such as defects on a perfectly flat heater creating local barriers. However, the consequence of such patterns of posts is that the local temperature of the substrate varies at each contact location. While temperature variation was acceptable for the previous generations, more uniform temperature control is sought for current and future nodes. For example, in conventional hardmask films this local temperature variations result in local variations of thickness around 1%, and a corresponding local variation in the film dielectric constant (k), leading to issues with integration and yield loss. However, the first section of this disclosure describes a patterned surface 142 that improves substrate temperature uniformity over conventional approaches. The following sections describe how the substrate handling issues that originate from the patterns of posts 210 that result in better substrate temperature uniformity can be resolved.

Extensive testing and simulations were performed on the pedestal 104 as described herein. The pedestal 104 as described herein improved temperature uniformity by reducing a temperature delta in a substrate by 0.4 degrees Celsius, or greater.

Testing also included minimizing local temperature variations within a substrate. To minimize the localized temperature variations, the magnitude of the hot-spots originating from contact between a substrate and the posts 210 are to be minimized. Based on thermal simulation results, this is accomplished by reducing the diameter of each post 210; reducing the heights of the posts 210; and/or increasing the density of the posts 210 in the patterned surface 142. However, the negative consequence of reducing the diameter is poor chucking and increased backside damage due to small post size (i.e., less contact area leads to high pressure at the contact area).

Improving thermal uniformity of a substrate typically includes increasing the post density and/or reducing the post height. However, reducing the post height constricts gas flow under the substrate. Reducing the post height may also create differential shear forces on the substrate, which can cause the substrate to slide out of position on the pedestal. Increasing the post density also has the same flow constriction effect and the sliding issues as the reduction in post height. One simple way to resolve flow constriction and/or sliding issues is to make the post diameters smaller. However, this causes a loss of chucking force on the substrate, and limits the incoming bow of the substrate. Thus, one solution is to have high flow conductivity at the center of the pedestal with smaller diameter posts, but an increase in the post diameter as the posts move away from the center radially. This approach provides a high post to substrate contact area and thus a high chucking force applied to the substrate.

One additional competing factor is that increasing post density causes thermal non-uniformities such that hot/cold spots are evident on the substrate (such as electrode terminal locations in the pedestal 104). This can be resolved by selective post removal near such hot/cold spots. An issue that may arise is that post removal may again result in poor thermal uniformity if too many posts are removed. For example, removal of posts increases the pitch of the posts and thermal non-uniformity is increased.

Figure 8A:
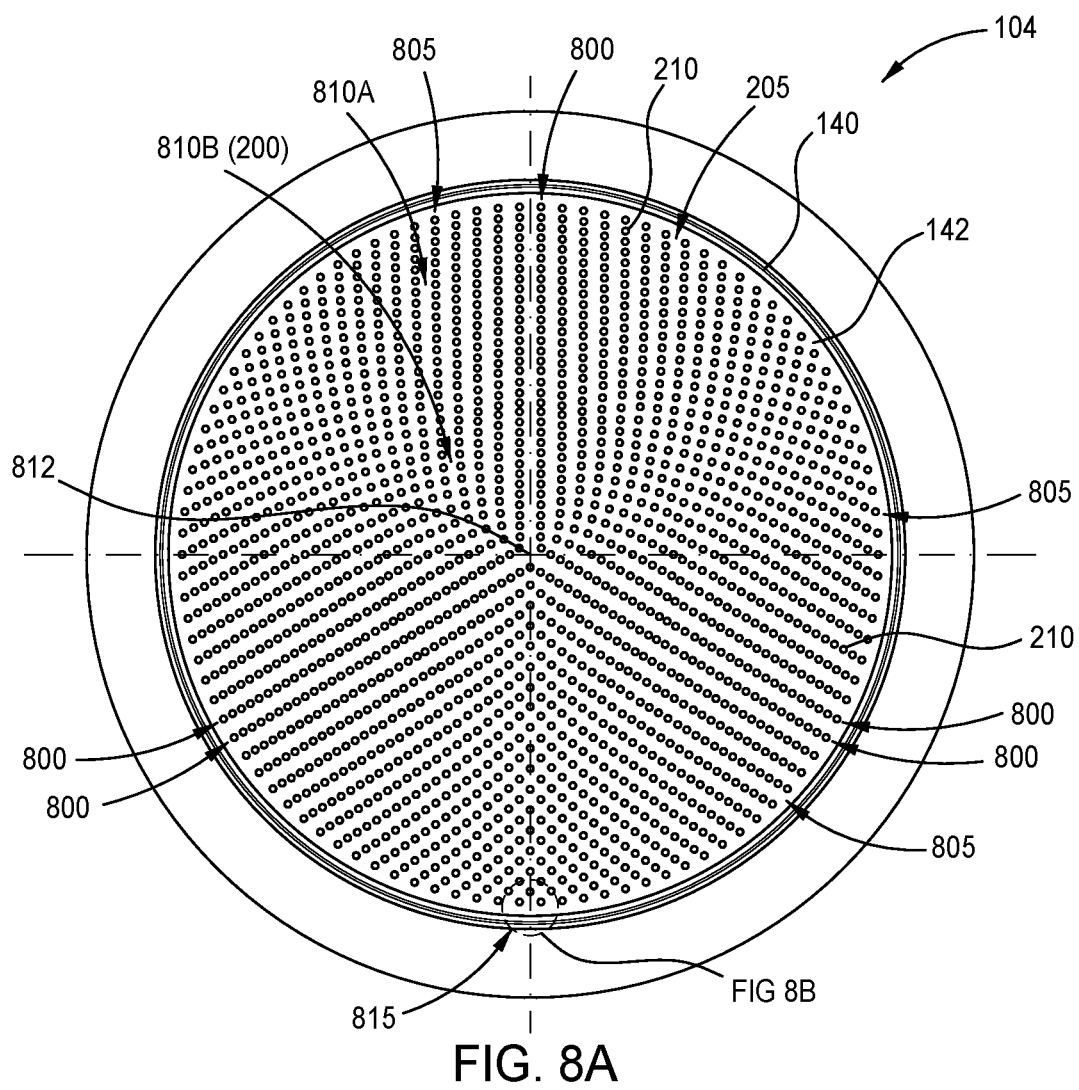
FIG. 8A is a top plan view a pedestal that may be used in the chamber of FIG. 1 according to another embodiment.
Figure 8B:
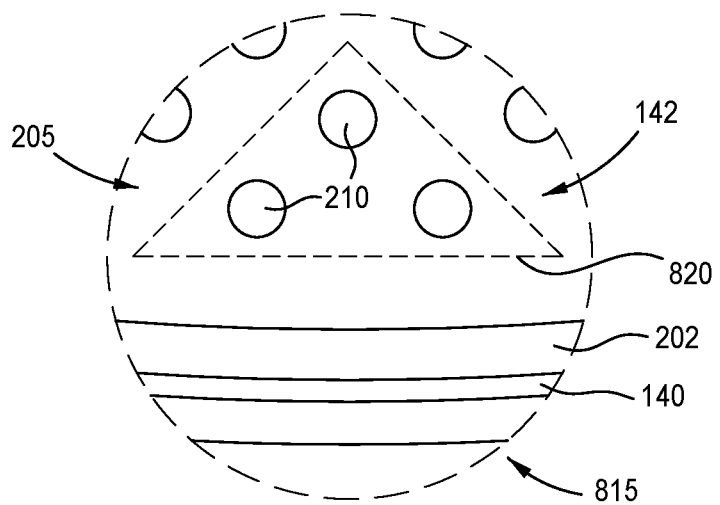
FIG. 8B is an enlarged plan view of a portion of the pedestal of FIG. 8A.

FIG. 8A is a top plan view a pedestal 104 according to another embodiment. FIG. 8B is an enlarged plan view of a portion of the pedestal 104 of FIG. 8A. The pedestal 104 as described herein may be manufactured according to the methods described above.

The pedestal 104 includes the patterned surface 142 having a plurality of posts 210 positioned thereon in a substantially radially oriented pattern. For example, a portion of the plurality of posts 210 are positioned in radially oriented rows 800 that are generally straight in plan view. Another portion of the plurality of posts 210 are arranged as inwardly curving rows 805. Each of the inwardly curving rows 805 have a first portion 810A in the peripheral region 205 and a second portion 810B in the central region 200. The posts 210 in the first portion 810A are generally a straight row or line of posts 210. The posts 210 in the second portion 810B are generally curved toward a center 812 of the pedestal 104. In the embodiment shown, three pairs of radially oriented rows 800 are positioned at about 120 degree intervals. A plurality of inwardly curving rows 805 are positioned between the pairs of radially oriented rows 800. The center 812 does not include a post in order to prevent a hot or cold spot on a substrate (i.e., a "bare location" described below).

FIG. 8B shows an edge 815 of the peripheral region 205 of the pedestal 104 where a portion of the plurality of posts 210 form a triangular pattern 820. The orientation of the posts 210 in the triangular pattern 820 is generally linear.

Figure 9:
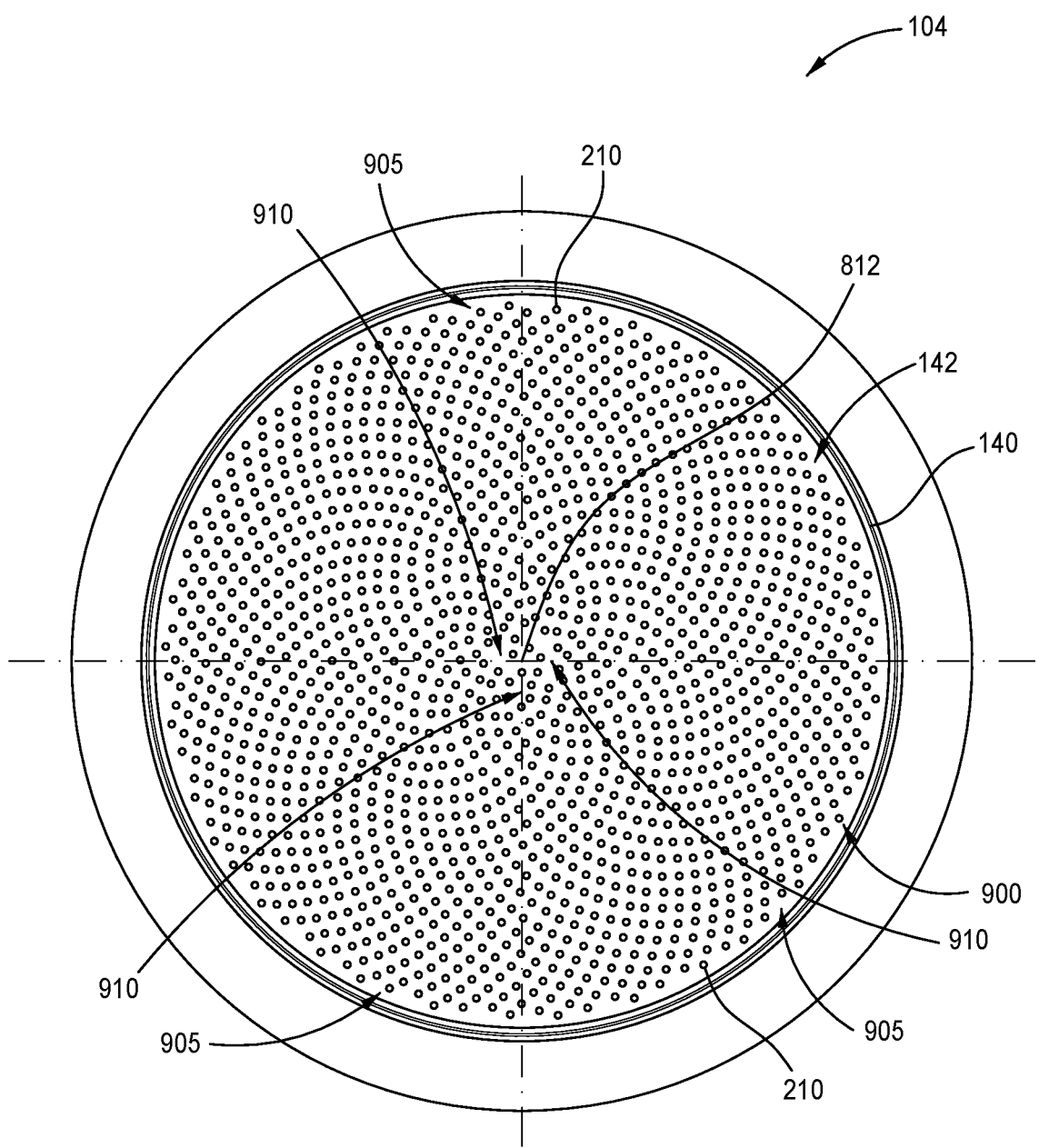
FIG. 9 is a top plan view a pedestal that may be used in the chamber of FIG. 1 according to another embodiment.

FIG. 9 is a top plan view a pedestal 104 according to another embodiment. The pedestal 104 includes the patterned surface 142 having a plurality of posts 210 positioned thereon in a spirograph pattern 900 (e.g., a geometric hypotrochoid and/or epitrochoid). The spirograph pattern 900 includes a plurality of spirals 905 formed by the plurality of posts 210. The pedestal 104 shown in FIG. 9 also includes a plurality of bare locations 910 where a post could be located. The bare locations 910 correspond to a location where a post would be formed (based on the remaining pattern or pitch of other posts) but do not include a post or posts in order to prevent a hot or cold spot on a substrate. The pedestal 104 as described herein may be manufactured according to the methods described above.

The plurality of posts 210 are arranged in the spirograph pattern 900 to prevent a straight line flow path and/or provide a torturous flow path for a gas applied to a backside of a substrate positioned on the pedestal 104. The tortuous flow path prevents formation of high velocity flow patterns which will result in wafer sliding.

In some implementations, the plurality of posts 210 are circular in plan view as shown in FIGS. 8A-9, and each of the plurality of posts 210 includes a diameter of about 1 millimeter (mm) to about 2 mm. The number of posts 210 (for a 300 mm substrate) is about 121 posts to about 2500 posts across the patterned surface 142. A distance between the outermost posts 210 of the edge 815 (shown in FIG. 8B) and the innermost portion of the peripheral ledge 202 is about 105 mm to about 3 mm. The contact area of the posts 210 is about 0.14 percent to about 11 percent (the contact area being the collective area where the upper surface 215 of each of the posts 210 contacts a substrate).

Figure 10:
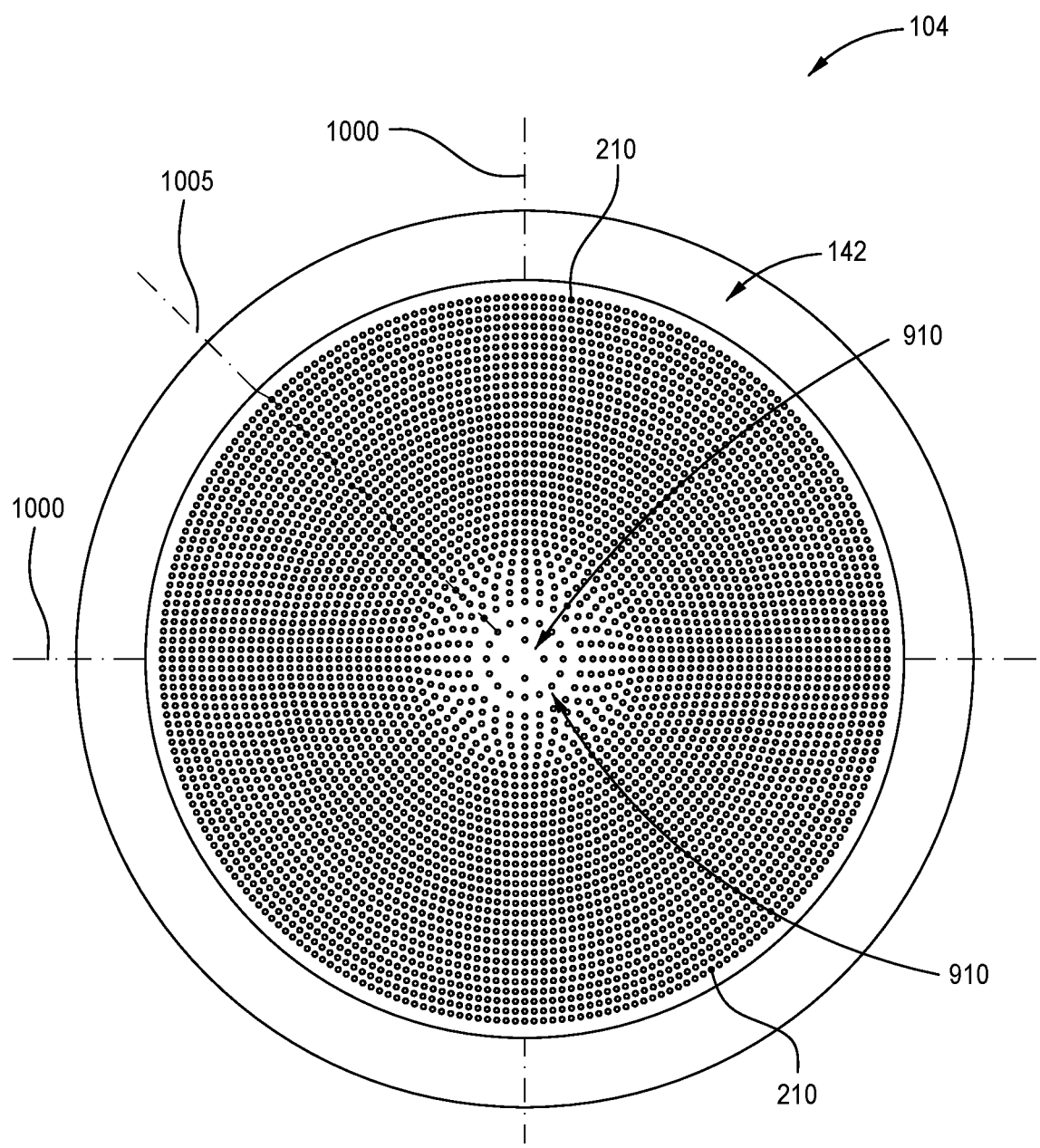
FIG. 10 is a top plan view a pedestal that may be used in the chamber of FIG. 1 according to another embodiment.

FIG. 10 is a top plan view a pedestal 104 according to another embodiment. The pedestal 104 includes the patterned surface 142 having a plurality of posts 210 positioned thereon in a pattern that is symmetrical relative to a radial axis 1000. The pedestal 104 shown in FIG. 10 also includes a plurality of bare locations 910 where a post could be located. The bare locations 910 correspond to a location where a post would be formed (based on the remaining pattern or pitch of other posts) but do not include a post or posts in order to prevent a hot or cold spot on a substrate. The pedestal 104 as described herein may be manufactured according to the methods described above.

The plurality of posts 210 are arranged in the symmetrical pattern shown in FIG. 10 to prevent a straight line flow path and/or provide a torturous flow path for a gas applied to a backside of a substrate positioned on the pedestal 104. The tortuous flow path prevents formation of high velocity flow patterns which will result in wafer sliding. For example, the pedestal 104 shown in FIG. 10 includes a plurality of serpentine post rows 1005 extending radially from a center of the pedestal 104.

In some implementations, the plurality of posts 210 are circular in plan view as shown in FIGS. 8A-10, and each of the plurality of posts 210 includes a diameter of about 1 millimeter (mm) to about 2 mm. The number of posts 210 (for a 300 mm substrate) is about 121 posts to about 2500 posts across the patterned surface 142. A distance between the outermost posts 210 of the edge 815 (shown in FIG. 8B) and the innermost portion of the peripheral ledge 202 is about 105 mm to about 3 mm. The contact area of the posts 210 is about 0.14 percent to about 11 percent (the contact area being the collective area where the upper surface 215 of each of the posts 210 contacts a substrate).

In some implementations, the diameters of the posts 210 decrease from the edge to the center. For example, posts near the edge 815 could have a diameter of about 2 mm, posts 210 in the central region 200 could have a diameter of about 0.75 mm, and posts 210 between the edge 815 and the central region 200 could have a diameter of about 1 mm. In other implementations, the diameters of the posts 210 increase from the edge to the center. Gradual changes in the post diameters from the center to the edge maximize the flow conductivity to improve substrate handling as well as increasing thermal uniformity. An increase in post diameters towards the edge also helps increase the contact area between the posts and the substrate, which increases the overall chucking force applied to the substrate. This is beneficial for substrates with a large bow.

While the foregoing is directed to embodiments of the present disclosure, other and further embodiments of the disclosure may be devised without departing from the basic scope thereof.

What is claimed is:

1. A pedestal, comprising:
 a body having a heater embedded therein, and
 an electrode coupled to the body for chucking a substrate, wherein the body comprises:
  a patterned surface, comprising:
   a first region having a first plurality of posts extending from a base surface of the body to a first height; and
   a second region outward of the first region and having a second plurality of posts extending from the base surface to a second height that is greater than the first height, wherein an upper surface of each of the first plurality of posts and the second plurality of posts are arranged in a spirograph pattern that prevents a straight line flow path when a gas is applied between the base surface and a substrate supported on the patterned surface, are coplanar, and define a substrate receiving surface, and wherein the patterned surface includes one or more bare locations disposed between the first plurality of posts and the second plurality of posts.

2. The pedestal of claim 1, wherein an average surface roughness of the base surface is greater than an average surface roughness of the upper surface of each of the posts.

3. The pedestal of claim 1, wherein the second height is 1.5 times greater than the first height.

4. The pedestal of claim 1, wherein the second height is 2 times greater than the first height.

5. The pedestal of claim 1, wherein the second height is 2.5 times greater than the first height.

6. The pedestal of claim 1, wherein the second height is 3 times greater than the first height.

7. The pedestal of claim 1, further comprising a third plurality of posts that extend from the base surface at a height that is different than the first height and the second height.

8. The pedestal of claim 1, wherein the first region has a surface area less than a surface area of the second region.

9. A pedestal, comprising:
 a body having a heater embedded therein, the body comprising:
  a patterned surface comprising:
   a central region having a first plurality of posts extending from a base surface of the body at a first height;
   a peripheral region surrounding the central region having a second plurality of posts extending from the base surface at a second height that is greater than the first height, wherein an upper surface of each of the first plurality of posts and the second plurality of posts are arranged in a spirograph pattern that prevents a straight line flow path when a gas is applied between the base surface and a substrate supported on the patterned surface, are coplanar, and define a substrate receiving surface; and
   one or more bare locations disposed between the first plurality of posts and the second plurality of posts.

10. The pedestal of claim 9, wherein an average surface roughness of the base surface is greater than an average surface roughness of the upper surface of each of the posts.

11. The pedestal of claim 9, wherein each of the first plurality of posts are positioned on a raised surface and each of the second plurality of posts are positioned on a recessed surface.

12. The pedestal of claim 9, wherein the second height is 1.5 times greater than the first height.

13. The pedestal of claim 9, wherein the second height is 2 times greater than the first height.

14. The pedestal of claim 9, wherein the second height is 2.5 times greater than the first height.

15. The pedestal of claim 9, wherein the second height is 3 times greater than the first height.

16. The pedestal of claim 9, wherein the second height is 3.5 times greater than the first height.

17. The pedestal of claim 9, wherein the central region has a surface area less than a surface area of the peripheral region.

18. A pedestal, comprising:
    a body having a heater embedded therein, and
    an electrode coupled to the body for chucking a substrate, wherein the body comprises:
        a patterned surface, comprising:
            a first region having a first plurality of posts extending from a base surface of the body to a first height;
            a second region outward of the first region and having a second plurality of posts extending from the base surface to a second height that is greater than the first height, wherein an upper surface of each of the first plurality of posts and the second plurality of posts are coplanar, arranged in a spirograph pattern that prevents a straight line flow path when a gas is applied between the base surface and a substrate supported on the patterned surface, and define a substrate receiving surface; and
        one or more bare locations corresponding to a location where a post of the first and second plurality of posts would be in the spirograph pattern, wherein the base surface, the first plurality of posts and the second plurality of posts provide a tortuous flow path when a gas is applied to the first and second regions.

19. The pedestal of claim 18, wherein each of the first plurality of posts and the second plurality of posts comprise a diameter, and the diameters increase from a center of the patterned surface to an edge of the patterned surface.

\* \* \* \* \*